United States Patent [19]

Ichikawa et al.

[11] Patent Number: 5,744,282
[45] Date of Patent: Apr. 28, 1998

[54] PHOTOSENSITIVE RESIN COMPOSITIONS AND PHOTOSENSITIVE ELEMENT USING THE SAME

[75] Inventors: Tatsuya Ichikawa; Tatsuo Chiba, both of Hitachi, Japan

[73] Assignee: Hitachi Chemical Co., Ltd., Tokyo, Japan

[21] Appl. No.: 630,479

[22] Filed: Apr. 10, 1996

[30] Foreign Application Priority Data

| Apr. 19, 1995 | [JP] | Japan | 7-093536 |
| Apr. 27, 1995 | [JP] | Japan | 7-104480 |
| Jun. 28, 1995 | [JP] | Japan | 7-162445 |

[51] Int. Cl.$^6$ ........................ G03F 7/033
[52] U.S. Cl. ........................ 430/284.1; 430/283.1; 522/95; 522/63; 522/117
[58] Field of Search ............... 430/284.1, 283.1; 522/95, 63, 117

[56] References Cited

U.S. PATENT DOCUMENTS

| 3,905,815 | 9/1975 | Bonham | 96/68 |
| 4,129,486 | 12/1978 | Deutsch et al. | 430/284.1 X |
| 4,702,997 | 10/1987 | Ai et al. | 430/284.1 |
| 4,855,215 | 8/1989 | Nakano et al. | 430/283.1 |
| 4,877,818 | 10/1989 | Emmons et al. | 522/117 X |
| 4,920,034 | 4/1990 | Takahashi et al. | 430/284.1 X |
| 5,250,591 | 10/1993 | Fuji et al. | 522/117 X |

FOREIGN PATENT DOCUMENTS

| 0 249 468 | 12/1987 | European Pat. Off. . |
| 8062841 | 3/1996 | Japan . |
| 2 085 023 | 4/1982 | United Kingdom . |

OTHER PUBLICATIONS

Registry No. 40220–08–4, Registry, Copyright 1996 ACS from Chemical Abstracts.

"Chemical Abstracts, vol. 93, No. 12, 22 Sep. 1980; Abstract No. 116032M; R. I. Dryagileva, et al Photoinitiated Copolymerization of Isocyanurate Oligomers", p. 76, col. 1.

Chemical Abstracts, vol. 98, No. 4, 24 Jan. 1983, Abstract No. 17534Y, p. 34, col. 1.

Chemical Abstracts, vol. 98, No. 4, 24 Jan. 1983, Abstract No. 17544B, p. 34, col. 2.

Chemical Abstracts, vol. 81, No. 24, 16 Dec. 1974, Abstract No. 154746G, p. 136, col. 2.

*Primary Examiner*—Cynthia Hamilton
*Attorney, Agent, or Firm*—Antonelli, Terry, Stout, & Kraus, LLP

[57] ABSTRACT

A photosensitive resin composition comprising (A) a binder polymer having carboxyl groups, (B) a photopolymerizable compound having at least one polymerizable ethylenically unsaturated group in the molecule, and (C) a photoinitiator can provide a film excellent in mechanical strength, chemical resistance, flexibility, and suitable for producing a photosensitive element.

6 Claims, No Drawings

PHOTOSENSITIVE RESIN COMPOSITIONS AND PHOTOSENSITIVE ELEMENT USING THE SAME

BACKGROUND OF THE INVENTION

The present invention relates to a photosensitive resin composition and a photosensitive element using the same.

In the art of manufacture of printed circuit boards, photosensitive elements made of photosensitive resin compositions with a support and a protective film have been popularly used as resist in such treatments as etching and plating.

A printed circuit board is manufactured by a process, comprising the steps of laminating a photosensitive film on a copper substrate, subjecting it to pattern exposure, removing the unexposed portion with a developer, carrying out etching or plating to form a pattern, and then stripping the cured portion from the substrate.

An alkaline developer comprising a sodium bicarbonate solution or the like is popularly used as developer for removing the unexposed portion. Usually developer is used as long as it maintains the ability to dissolve the photosensitive layer to a desired degree, and in use thereof, the photosensitive resin composition is dissolved or dispersed in the , developing solution.

With the recent trend toward higher density of printed circuit boards, which entails reduction of contact area between the copper substrate and the pattern-formed photosensitive layer, it is required of the composition used for forming the photosensitive layer to show excellent adhesiveness, mechanical strength, chemical resistance and flexibility in the development, etching or plating step.

For the improvement of chemical resistance, methods using a photopolymerizable compound having isocyanurate rings are disclosed in JP-A-61-77844, JP-A-62-290705, JP-A-61-14212, JP-A-59-222480, JP-A-1-14190, JP-A-57-55914, JP-A-5-216224, JP-A-5-273754, etc., but these methods have the problem that the cured film of said compound is hard and frangible.

On the other hand, from the viewpoint of improvement of processability, a photosensitive resin composition having high sensitivity and little possibility of causing contamination of the plating bath is desired, but these properties are dependent on the type and amount of the photoinitiator used in the composition.

High-sensitivity photoinitiators are disclosed in DE-AS 2027467, EP-A 11786, EP-A 220, EP-A 589, JP-A 6-69631, etc., but these photoinitiators have the disadvantage that they may cause contamination of the plating bath.

Photoinitiators with low possibility of causing plating bath contamination and high sensitivity are proposed in JP-A-60-239744, JP-A-2-226149, etc., but they are at a disadvantage in that their sensitivity is low.

U.S. Pat. No. 3,479,185 discloses a photosensitive resin composition comprising a 2,4,5-triphenylimidazole dimer, which is a photoinitiator with low possibility of causing plating bath contamination, combined with a hydrogen donative compound to elevate sensitivity. This composition, however, has the drawbacks that in case sensitivity of the composition has been adjusted to a desired level, when the amount of said 2,4,5-triphenylimidazole dimer used is increased, the line width of the resist is enlarged, while when the amount of the hydrogen donative compound is increased, adhesiveness to copper and storage stability are deteriorated.

Combination of a 2,4,5-triphenylimidazole dimer and a compound having a highly reactive ethylenically unsaturated group (such as polyethylene glycol dimethacrylate) has also been studied, but this combination is very poor in chemical resistance.

SUMMARY OF THE INVENTION

The present invention proposes to solve the problems of the prior art and, to this end, it provides a photosensitive resin composition which can satisfy various property requirements such as mentioned above by using as an ethylenically unsaturated compound a compound in which an isocyanurate ring and an acrylate (or methacrylate) are bonded by a flexible alkylene oxide group (such as polyethylene oxide group or polypropylene oxide group) and an alkylene group (such as hexamethylene group), and if necessary, to improve plating resistance by adding a dicyanediamide thereto. This resin composition has excellent mechanical strength, chemical resistance and flexibility. Also the present invention provides a photosensitive element using said photosensitive resin composition.

The present invention further provides a photosensitive resin composition improved in adhesiveness, photosensitivity, plating bath anti-contamination property, etc., by use of a specific combination of a photopolymerizable compound containing an ethylenically unsaturated group and a photoinitiator, and a photosensitive element using such a composition.

The present invention further provides a photosensitive resin composition comprising:

(A) a binder polymer having carboxyl groups;
(B) at least one photopolymerizable compound having at least one polymerizable ethylenically unsaturated group in the molecule;
(C) a photoinitiator; and if necessary
(D) dicyandiamide, wherein said component (B) must comprise a compound represented by the formula:

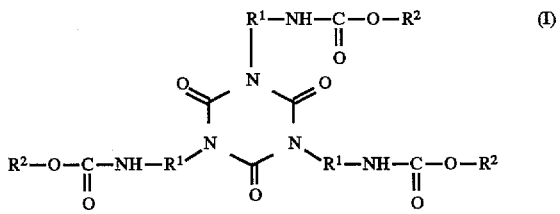

wherein $R^1$ is a divalent organic group and each $R^2$ represents independently a group of the formula:

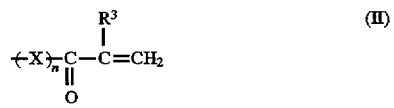

wherein $R^3$ is a hydrogen atom or a methyl group; X is an alkylene oxide group containing 2–10 carbon atoms; and n is an integer of 1 to 14.

The present invention further provides a photosensitive element comprising a support and a layer of said photosensitive resin composition formed thereon.

The present invention additionally provides a photosensitive resin composition comprising:

(A) a binder polymer having carboxyl groups;
(B') at least one photopolymerizable compound having at least one polymerizable ethylenically unsaturated group in the molecule; and
(C') a photoinitiator containing a 2,4,5-triphenylimidazole dimer, wherein one constituent of said component (B') is a compound represented by the formula (I) or a compound of the formula:

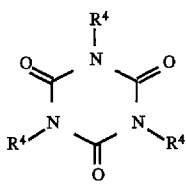 (IV)

wherein $R^4$s represent independently a group of the formula:

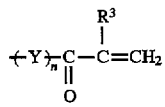 (V)

wherein Y is $$-CH_2CH_2-O-, \quad -\overset{CH_3}{\underset{|}{CH}}-CH_2-O-$$

$$\text{or} \quad -CH_2-\overset{CH_3}{\underset{|}{CH}}-O-;$$

$R^3$ is a hydrogen atom or a methyl group; and n is an integer of 1 to 14, or of the formula:

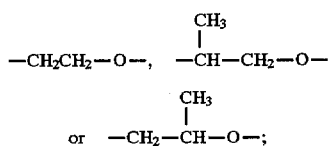 (VI)

wherein $R^3$ is a hydrogen atom or a methyl group; p is an integer of 1 to 9; and n is an integer of 1 to 14.

The present invention also provides a photosensitive element comprising a support and a layer of said photosensitive resin composition formed thereon.

DESCRIPTION OF THE PREFERRED EMBODIMENTS

The photosensitive resin composition according to a first embodiment of the present invention comprises:

(A) a binder polymer having carboxyl groups;

(B) at least one photopolymerizable compound having at least one polymerizable ethylenically unsaturated group in the molecule;

(C) a photoinitiator; and if necessary, (D) dicyandiamide.

wherein said component (B) must contain a compound represented by the formula:

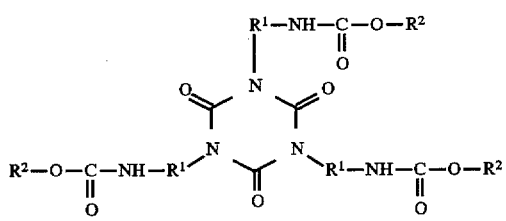 (I)

wherein $R^1$ is a divalent organic group; and each $R^2$ represents independently a group of the formula:

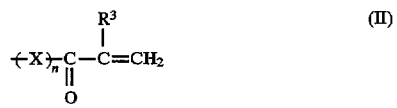 (II)

wherein $R^3$ is a hydrogen atom or a methyl group; X is an alkylene oxide group; and n is an integer of 1 to 14.

The binder polymers having carboxyl groups usable as component (A) in this invention include homopolymers of acrylic and methacrylic acid [when the term "(meth)acrylic acid" is used in the present specification, it means both acrylic acid and methacrylic acid] and copolymers thereof with vinyl monomers copolymerizable therewith.

Examples of said vinyl monomers, which are not specified in this invention, include methyl (meth)acrylate, ethyl (meth)acrylate, butyl (meth)acrylate, 2-ethylhexyl (meth)acrylate, tetrahydrofurfuryl (meth)acrylate, dimethylaminoethyl (meth)acrylate, diethylaminoethyl (meth)acrylate, glycidyl methacrylate, 2,2,2-trifluoroethyl (meth)acrylate, 2,2,3,3-tetrafluoropropyl (meth)acrylate (and corresponding acrylates), acrylamide, diacetoacrylamide, styrene, vinyltoluene and the like.

The binder polymer (A) used in the present invention is preferably soluble or swellable in alkaline solutions (such as 1–3 wt % sodium carbonate or potassium carbonate solutions) for facilitation of development or for environmental protection.

The acid value of the binder polymer (A) preferably falls in a range of 100 to 500. When the acid value is less than 100, the time required for the development tends to be elongated, and when the acid value exceeds 500, the photocured resist tends to exhibit reduced resistance to developer.

The weight-average molecular weight (measured by gel permeation chromatography (GPC) and calculated as polystyrene) of said binder polymer is preferably in a range of 20,000 to 300,000. When the weight-average molecular weight is less than 20,000, developer resistance of said polymer tends to lower, and when it exceeds 300,000, the development time tends to be elongated.

In the compound of the formula (I) contained as an essential component in the photopolymerizable compound (B) having at least one polymerizable ethylenically unsaturated group in the molecule, the divalent organic group represented by $R^1$ in the formula (I) has not been specified. However, this group may be, for instance, an alkylene group including methylene, ethylene, propylene, isopropylene, butylene, isobutylene, pentylene, neopentylene, hexylene, heptylene, octylene, 2-ethylhexylene, nonylene, decylene or the like.

In the formula (II) represented by $R^2$, X (alkyleneoxide group) has also not been specified and can, for instance, be selected from the group consisting of ethylene oxide group, propylene oxide group, butylene oxide group, pentylene oxide group and hexylene oxide group. Ethylene oxide group and propylene oxide group are preferred.

There are the following two types of bonding of propylene oxide group:

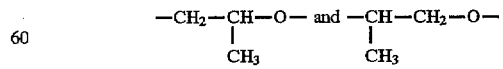

In the formula (II), n has to be an integer of 1 to 14, preferably 2 to 14. When n is greater than 14, the mechanical strength of the composition lowers.

The compounds of the formula (I) can be obtained by reacting, for example, the compounds represented by the formula (II-1), (II-2) or (II-3) with the compounds represented by the formula (III):

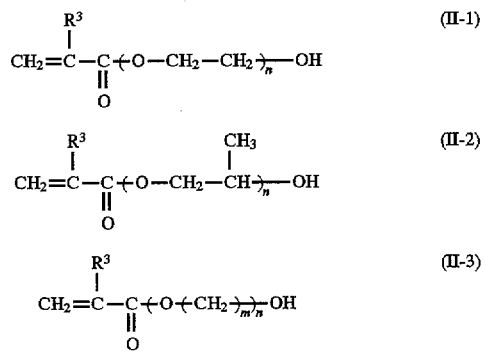

wherein $R^3$ and n represent the same as defined in the formula (II), and m is an integer of 3 to 6;

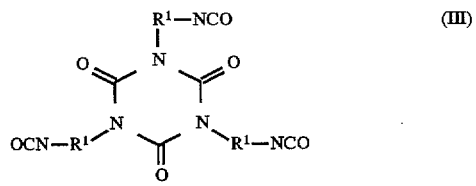

wherein $R^1$ is as defined in the formula (I).

In the above formula (II-2), the propylene oxide unit of the block segment is depicted such that the methyl group is bonded to the carbon atom next but one to the oxygen atom for the convenience of depiction, but the segment is not limited to this structure but includes the following:

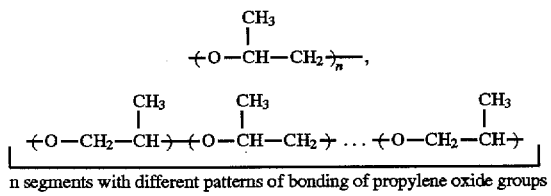

n segments with different patterns of bonding of propylene oxide groups

The compounds of the formula (I) usable in the present invention include those commercially available under the trade names NK Oligo UA-21 (compound of the formula (I) wherein $R_1$=—$C_6H_{12}$—, $R_2$=—$CH_3$, X=—$CH_2CH_2O$— and n=4 (average)), NK Oligo UA-41 ($R_1$=—$C_6H_{12}$—, $R_2$=—$CH_3$, X=$CH_2$—$CH(CH_3)$—O— or —$CH(CH_3)$—$CH_2$—O—, n=5 (average)), NK Oligo UA-42 ($R_1$=—$C_6H_{12}$—, $R_2$=—$CH_3$, X=—$CH_2$—$CH(CH_3)$—O— or —$CH(CH_3)$—$CH_2$—O—, n=9 (average), and NK Oligo UA-44 ($R_1$=—$C_6H_{12}$—, $R_2$=—H, X=—$CH_2$—$CH(CH_3)$—O— or —$CH(CH_3)$—$CH_2$—O—, n=6 (average), all available from Shin-Nakamura Chemical Industries Co., Ltd.).

Other compounds than those of the formula (I) usable as an essential component of the component (B) include the compounds obtainable by reacting α,β-unsaturated carboxylic acids with polyhydric alcohols (polyethylene glycol di(meth)acrylate (e.g. number of the ethylene groups: 2–14), trimethylolpropane di(meth)acrylate, trimethylolpropane tri (meth)acrylate, tetramethylolmethane tri(meth)acrylate, tetramethylolmethane tetra(meth)acrylate, polypropylene glycol di(meth)acrylate (number of the ethylene groups: 2–14), dipentaerythritol penta(meth)acrylate, dipentaerythritol hexa(meth)acrylate, etc.), the compounds obtainable from addition reaction of α,β-unsaturated carboxylic acids with glycidyl group-containing compounds (bisphenol A dioxyethylene di(meth)acrylate, bisphenol A trioxyethylene di(meth)acrylate, bisphenol A decaoxyethylene di(meth) acrylate, trimethylolpropane triglycidylether tri(meth) acrylate, bisphenol A diglycidylether (meth)acrylate, etc.), and alkyl esters of (meth)acrylic acid (methyl (meth) acrylate, ethyl (meth)acrylate, butyl (meth)acrylate, 2-ethylhexyl (meth)acrylate, etc.).

As photoinitiator (component (C)), there can be used, for instance, aromatic ketones (benzophenone, N,N'-tetramethyl-4,4'-diaminobenzophenone (Michler's ketone), N,N'-tetramethyl-4,4'-diaminobenzophenone, 4-methoxy-4'-dimethylaminobenzophenone, 2-ethylanthraquinone, phenanthrenequinone, etc.), benzoins (benzoin ethers such as benzoin methyl ether, benzoin ethyl ether and benzoin phenyl ether, methylbenzoin, ethylbenzoin, etc.), benzyl derivatives (benzyl dimethyl ketal, etc.), 2,4,5-triarylimidazole dimers (e.g. 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)- 4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.), and acridine derivatives (9-phenylacridine, 1,7-bis(9,9'-acridinyl)heptane, etc.). These compounds may be used singly or in combination of two or more of them.

The ratio of the component (A) in the composition of the present invention is preferably 40 to 80 parts by weight per 100 parts by weight of the total of the components (A) and (B). When the ratio of the component (A) is less than 40 parts by weight, the photocured composition tends to become frangible and the photosensitive element made thereof may prove poor in coating properties. When the ratio exceeds 80 parts by weight, the composition sensitivity tends to lower.

The ratio of the component (B) is preferably 20 to 60 parts by weight per 100 parts by weight of the total of the components (A) and (B). When the ratio of the component (B) is less than 20 parts by weight, the composition sensitivity tends to lower, and when the ratio exceeds 60 parts by weight, the photocured composition tends to become frangible.

The ratio of the compound of the formula (I) used as an essential constituent of the component (B) is preferably 3 parts by weight or above, more preferably 5 to 40 parts by weight per 100 parts by weight of the total of the components (A) and (B). When the ratio of this compound is less than 3 parts by weight, the composition tends to prove low in sensitivity, adhesiveness and plating resistance.

The ratio of the component (C) is preferably 0.1 to 20 parts by weight per 100 parts by weight of the total of the components (A) and (B). When the ratio of the component (C) is less than 0.1 part by weight, the composition sensitivity tends to lower, and when the ratio exceeds 20 parts by weight, light absorption at the surface of the composition tends to increase when exposed to light, causing imperfect photocuring in the inside portion of the composition.

The ratio of dicyandiamide used as an optional component (D) in the present invention is preferably 0.01 to 1 part by weight per 100 parts by weight of the total of the components (A) and (B). When the ratio of the component (D) is less than 0.01 part by weight, plating resistance of the composition tends to lower, and when the ratio exceeds 1 part by weight, an undeveloped part (or development residue) may take place.

The photosensitive resin composition in a second embodiment of the present invention comprises:

(A) a binder polymer having carboxyl groups;
(B') a photopolymerizable compound having at least one polymerizable ethylenically unsaturated group in the molecule; and
(C') a photoinitiator containing a 2,4,5-triphenylimidazole dimer, wherein one constituent of the component (B') is a compound represented by the formula (I) or a compound of the formula:

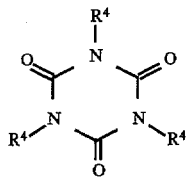    (IV)

wherein each $R^4$ represents independently the formula:

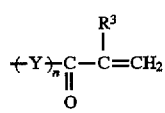    (V)

wherein Y is $$-CH_2CH_2-O-, \quad -\overset{CH_3}{\underset{|}{CH}}-CH_2-O- \quad \text{or} \quad -CH_2-\overset{CH_3}{\underset{|}{CH}}-O-;$$

$R^3$ is a hydrogen atom or a methyl group and n is an integer of 1 to 14, or the formula:

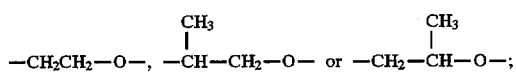    (VI)

wherein $R^3$ is a hydrogen atom or a methyl group; p is an integer of 1 to 9; and n is an integer of 1 to 14.

The component (A) of this composition is the same as used in the photosensitive resin composition of the first embodiment described above.

In the formula (IV) of the compound used as the photopolymerizable compound (component (B')) having at least one polymerizable ethylenically unsaturated group in the molecule, n is an integer of 0 to 9, preferably 3 to 6. When n is greater than 9, mechanical strength of the composition is low.

When $R^4$ in the formula (IV) is the formula (V) or (VI), n is an integer of 1 to 14, preferably 4 to 14, and p is an integer of 1 to 9, preferably 1 to 6. When n is greater than 14, chemical resistance of the composition is low, and when p is greater than 9, the composition is unsatisfactory in developing performance.

The compounds of the formula (IV) can be obtained by reacting, for instance, the compounds represented by the formula:

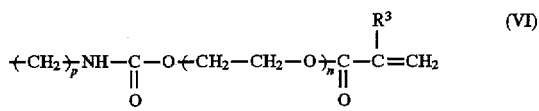    (VII)

wherein q is an integer of 1 to 9, and the compounds represented by the formula:

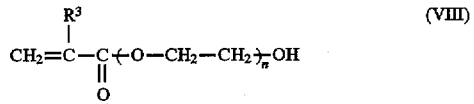    (VIII)

wherein $R^3$ is a hydrogen atom or a methyl group, and n is an integer of 1 to 14. In the formula (VII), q is preferably 3 to 6. When q is greater than 9, mechanical strength of the composition is low.

Regarding the compounds of the formula (IV), the respective $R^4$'s in the formula may be different from each other, and also the number of the methylene groups or the number of the ethylene glycol groups in one $R^4$ may be different from that in the other.

The compounds of the formula (IV) usable in the present invention include those commercially available, such as NK Oligo UA-21 (available from Shin-Nakamura Chemical Industries Co., Ltd.); corresponding to the compound of the formula (IV) in which $R^4$ represents the formula (VI), viz. the compound of the formula:

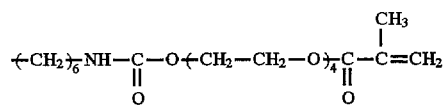

As the component (B'), beside the compounds of the formula (I) and (IV), there can be used the compounds mentioned above as the component (B) other than the compounds of the formula (I) in the photosensitive resin composition according to the first embodiment of the present invention.

It is essential that the photoinitiator used as component (C') in the composition of the present invention contains a 2,4,5-triphenylimidazole dimer such as 2,2'-bis(o-chlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(p-carboxyphenyl)-4,4',5,5'-tetraphenylbiimidazole, 2,2'-bis(p-chlorophenyl)-4,4',5,5'-tetrakis(p-methoxyphenyl)-biimidazole, 2,2'-di-o-tolyl-4,4', 5,5'-tetraphenylbiimidazole, 2,2'-di-p-tolyl-4,4'-di-o-tolyl-5, 5'-diphenylbiimidazole and the like. These dimers may be used singly or in combination of two or more of them.

Other photoinitiators than the 2,4,5-triphenylimidazole dimers usable in the present invention include aromatic ketones (benzophenone, N,N'-tetramethyl-4,4'-diaminobenzophenone (Michler's ketone), N,N'-tetramethyl-4,4'-diaminobenzophenone, 4-methoxy-4'-dimethylaminobenzophenone, 2-ethylanthraquinone, phenanthrequinone, etc.), benzoins (benzoin ethers such as benzoinmethyl ether, benzoinethyl ether and benzoinphenyl ether, methylbenzoin, ethylbenzoin, etc.), and benzyl derivatives (benzyl dimethyl ketal, etc.), which may be used singly or in combination of two or more of them.

In the photosensitive resin composition according to the second embodiment of the present invention (hereinafter referred to as the second photosensitive resin composition of the present invention), a specific combination of said component (B') and said component (C') is instrumental in enhancing photosensitivity and improving adhesiveness, chemical resistance, flexibility and plating bath anti-contamination properties.

In the second photosensitive resin composition, the ratio of the component (A) is preferably 40 to 80 parts by weight per 100 parts by weight of the total of the components (A) and (B'). When the ratio of the component (A) is less than 40 parts by weight, the photocured product of the composition tends to become frangible, and the photosensitive element made thereof tends to deteriorate in coating characteristics. When the ratio exceeds 80 parts by weight, the composition sensitivity tends to lower.

The ratio of the component (C') preferably falls in a range of 0.1 to 20 parts by weight per 100 parts by weight of the total of the components (A) and (B'). When the ratio of the component (C') is less than 0.1 part by weight, the composition sensitivity tends to lower, and when the ratio is over 20 parts by weight, light absorption at the surface of the composition increases when exposed to light, causing imperfect photocuring of the inside portion of the composition.

The ratio of the 2,4,5-triphenylimidazole dimer(s) used as an essential constituent of the component (C') is preferably 1 part by weight or more per 100 parts by weight of the total of the components (A) and (B'). When the ratio of said dimer(s) is less than 1 part by weight, the composition tends to lack sensitivity.

The ratio of the component (B') is preferably 20 to 60 parts by weight per 100 parts by weight of the total of the components (A) and (B'). When the ratio of the component (B') is less than 20 parts by weight, the composition tends to lack sensitivity, and when the ratio exceeds 60 parts by weight, the photocured product of the composition tends to become frangible.

The ratio of the compound of the formula (I) or (IV) used as an essential constituent of the component (B') is usually not less than 3 parts by weight, preferably 5–40 parts by weight per 100 parts by weight of the total of the components (A) and (B'). When the ratio of said compound is less than 3 parts by weight, the composition tends to lower in sensitivity, adhesiveness and plating resistance.

In the second photosensitive resin composition of the present invention, a hydrogen donative compound (N-phenylglycin, 2-mercaptobenzothiazole, 2-mercaptobenzoxazole, 2-mercaptobenzimidazole, etc.) may be contained within limits not affecting adhesiveness to copper and storage stability of the composition.

Various additives such as dye, colorant, plasticizer, pigment, flame retardant, stabilizer, adhesiveness imparting agent, etc., may be contained as desired in the first and second photosensitive resin compositions of the present invention.

The first and second photosensitive resin compositions of the present invention may be made into a homogeneous solution by mixing and dissolving the respective components in a solvent capable of dissolving them, such as toluene, acetone, methylethyl ketone (MEK), methyl isobutyl ketone, methyl Cellosolve, ethyl Cellosolve, chloroform, methylene chloride, methyl alcohol, ethyl alcohol, etc.

The photosensitive element of the present invention can be produced by coating the first or second photosensitive resin composition of the present invention described above on a support and drying the coating.

As the support, polymer films such as polyethylene terephthalate film, polypropylene film and polyethylene film can be used. Polyethylene terephthalate film is preferred.

The polymer film used as support should not have such a surface treatment or should not be made of such a material that will make the film unseparable, since the film needs to be separated later from the photosensitive layer.

The thickness of the polymer film is preferably in a range of 5 to 100 µm, more preferably 10 to 30 µm. The polymer films may be laminated on both sides of the photosensitive layer, with one of the polymer films used as a support film of the photosensitive layer and the other serving as a protective film of the photosensitive layer.

For forming a photoresist image using the photosensitive element of the present invention, in case a protective film is present, a method may be employed in which after removal of the protective film the photosensitive layer is heated and pressed against the substrate to thereby laminate the layer on the substrate. The substrate surface on which the photosensitive layer is laminated is usually a metallic surface but not limited thereto.

The photosensitive layer heating temperature may be properly decided but is preferably selected from a range of 90° C. to 130° C. The pressure applied for bonding the photosensitive layer to the substrate is also not specified but preferably 3 kg/cm$^2$. If the photosensitive layer is heated as described above, it is not necessary to preheat the substrate, but the substrate may be preheated for facilitating lamination.

The thus laminated photosensitive layer is then exposed image wise to active light through a negative film or a positive film. In case the polymer film present on the photosensitive layer is transparent, exposure may be carried out with the polymer film allowed to stay, but when the polymer film is opaque, it should be removed before conducting exposure.

It is desirable for protection of the photosensitive layer that the polymer film is transparent, and that exposure is conducted without removing the polymer film but through this film.

As active light for exposure, there can be used the light generated from the known active light sources such as carbon arc lamp, mercury vapor lamp, xenon arc lamp, etc.

Sensitivity of the photoinitiator contained in the photosensitive layer is usually maximized in the ultraviolet region, so that in this case it is desirable to use an active light source which can effectively emit the ultraviolet rays.

In case the photoinitiator is a substance (such as 9,10-phenanethrequinone) which is sensitive to visible light rays, visible light is used as active light, and as light source, photoflood lamp, solar lamp, etc., can be used beside those mentioned above.

After exposure, the polymer film if present on the photosensitive layer is removed and then the non-exposed portion is removed by a known method such as spraying, dipping under shaking, brushing, scrubbing, etc., using an aqueous alkaline solution for development.

As the base of the aqueous alkaline solution, there can be used alkali metal carbonates, alkali metal hydroxides (e.g. alkali metal being lithium, sodium or potassium), alkali metal phosphates (potassium phosphate, sodium phosphate, etc.), alkali metal pyrophosphates and the like. An aqueous solution of sodium carbonate is preferably used.

The pH of the aqueous alkaline solution is preferably in a range of 9 to 11, and its temperature is adjusted inconformity to the developing performance of the photosensitive layer. A surfactant, deforming agent, small quantity of an organic solvent for promoting development, and other additives may also be contained in the aqueous alkaline solution.

A known method may be employed for fabricating a printed wiring board. For instance, the surface of the substrate exposed with the developed photoresist image as mask is subjected to etching, plating and other necessary treatments in the known ways.

The photoresist image can be eliminated with an aqueous alkaline solution having a stronger alkalinity than the alkaline solution used for the development. A 1–5 wt % aqueous solution of sodium hydroxide can be used as the strongly alkaline solution.

The present invention is further illustrated by the following Examples.

EXAMPLES 1–4 AND COMPARATIVE EXAMPLES 1–3

The materials shown in Table 1 and Table 2 were blended to prepare the solutions.

TABLE 1

| | Materials | Amount blended |
|---|---|---|
| Component (A) | 40 wt % methyl cellosolve/toluene (6/4 by weight) solution of methacrylic acid/methyl methacrylate/ethyl acrylate/ethyl methacrylate copolymer (22/45/27/6 by weight, weight-average molecular weight: 100,000) (acid value of solids: 144) | 150 g (solids: 60 g) |
| Component (C) | Diethylthioxanthone | 1.0 g |
| | Ethyl dimethylaminobenzoate | 4.0 g |
| | N,N'-tetraethyl-4,4'-diaminobenzophenone | 0.2 g |

TABLE 2

| | Materials | Amount blended |
|---|---|---|
| Colorant | Tribromomethylphenylsulfone | 0.5 g |
| | Leucocrystal violet | 0.5 g |
| Pigment | Malachite green | 0.05 g |
| Solvent | Methyl ethyl ketone | 10 g |
| | Toluene | 10 g |
| | Methanol | 3 g |
| Plasticizer | p-toluenesulfoneamide | 4.0 g |

In the obtained solutions was dissolved the component (B) shown in Table 3 to prepare the solutions of photosensitive resin compositions.

TABLE 3

(unit: g)

| | | Example | | | | Comp. Example | | |
|---|---|---|---|---|---|---|---|---|
| | | 1 | 2 | 3 | 4 | 1 | 2 | 3 |
| Component (B) | UA-21*¹ | 40 | — | — | — | — | — | — |
| | UA-41*² | — | 40 | — | — | — | — | — |
| | UA-42*³ | — | — | 40 | — | — | — | — |
| | UA-44*⁴ | — | — | — | 40 | — | — | — |
| | APG-400*⁵ | — | — | — | — | 15 | 15 | 40 |
| | MECHPP*⁶ | — | — | — | — | 15 | — | — |
| | HOAmpp*⁷ | — | — | — | — | — | 15 | — |

(Notes)
*¹: a compound of the formula (I) wherein $R^1$ is —$C_6H_{12}$—, $R^2$ is —$CH_3$, X is —$CH_2CH_2O$—, and n = 4 (average), available from Shin-Nakamura Chem. Ind. Co., Ltd.
*²: a compound of the formula (I) wherein $R^1$ is —$C_6H_{12}$—, $R^2$ is —$CH_3$, X is —$CH_2CH(CH_3)$—O— or —$CH(CH_3)$—$CH_2O$, n = 5 (average), available from Shin-Nakamural Chem. Ind. Co., Ltd.
*³: a compound of the formula (I) wherein $R^1$ is —$C_6H_{12}$—, $R^2$ is —$CH_3$, X is —$CH_2CH(CH_3)$—O— or —$CH(CH_3)$—$CH_2O$, n = 9 (average), available from Shin-Nakamura Chem. Ind. Co., Ltd.
*⁴: a compound of the formula (I) wherein $R^1$ is —$C_6H_{12}$—, $R^2$ is —H, X is —$CH_2CH(CH_3)$—O— or —$CH(CH_3)$—$CH_2O$, n = 6 (average), available from Shin-Nakamura Chem. Ind. Co., Ltd.
*⁵: polypropylene glycol diacrylate (produced by Shin-Nakamura Chem. Ind. Co., Ltd.)
*⁶: γ-chloro-β-hydroxypropyl-β'-methacryloyloxyethyl-o-phthalate
*⁷: β-hydroxypropyl-β'-methacryloyloxyethyl-o-phthalate Each of the thus obtained solutions of photosensitive resin compositions was uniformly coated on a 25 μm thick polyethylene terephthalate film and dried by a 100° C. convected hot-air dryer for about 10 minutes to obtain a photosensitive element. The thickness of the photosensitive resin composition layer after drying was 50 μm.

On the other hand, the copper surface of a copper-clad laminate (MCL-E-61, trade name, available from Hitachi Chemical Co., Ltd.) comprising a glass-reinforced epoxy having the copper foils (35 μm thick) laminated on both sides thereof was polished with a polishing machine (mfd. by Sankei Co., Ltd.) having a #600 brush, then washed with water and dried by an air flow. The resulting copper-clad laminate was heated to 80° C. and said photosensitive resin composition layer was laminated on the copper surface by heating to 120° C.

Then a Stouffer 21 step tablet was placed as negative film on the specimen and exposed at 60 mJ/cm² using an exposer HMW-201B (mfd. by Oak Corp.) having a high pressure mercury lamp.

Thereafter, the polyethylene terephthalate film was stripped off, then a 1 wt % sodium carbonate solution was sprayed at 30° C. for 60 seconds to remove the unexposed portion and the step number of the step tablet of the photocured film formed on the copper-clad laminate to evaluate the photosensitivity of the obtained photosensitive resin composition. The results are shown in Table 4.

Photosensitivity is indicated by the step number of the step tablet. The greater the step number is, the higher is photosensitivity.

Adhesiveness was determined from the line width (μm) which remained unseparated after development. The results are shown in Table 4. A smaller figure signifies stronger adhesion of the photosensitive resin composition layer to the copper-clad laminate, indicating that even a fine line can remain unseparated from the copper-clad laminate.

Plating resistance was determined in the following way. The photosensitive resin composition layer was laminated on a copper-clad laminate in the manner described above and then exposed at a prescribed light intensity. After development with said developer, the pretreatments were carried out successively in the following order: degreasing (5-minute immersion in 25 wt % PC-455 (produced by Meltex Inc.))→washing with water→soft etching (2-minute immersion in 150 g/l ammonium persulfate)→washing with water→one-minute immersion in 10 wt % sulfuric acid, followed by plating with copper sulfate in a copper sulfate plating bath (consisting of 75 g/l of copper sulfate, 190 g/l of sulfuric acid, 50 ppm of chlorine ions and 5 ml/l of Copper Gleam PCM (available from Meltex Inc.)) applying an electric current of 3 A/dm² at room temperature for 40 minutes.

The thus treated laminate was washed with water, immersed in 10 wt % borofluoric acid for one minute and then subjected to solder plating in a solder plating bath (composed of 64 ml/l of 45 wt % tin borofluoride, 22 ml/l of 45 wt % lead borofluoride, 200 ml/l of 42 wt % borofluoric acid, 20 g/l of Pulltin LA conductivity salt (available from Meltex Inc.) under current application of 1.5 A/dm² at room temperature for 15 minutes.

After washing with water and drying, an adhesive tape was pasted to the laminate surface and then peeled off in the vertical direction (90° peel-off test). Observation was made to see whether peel of the resist took place or not. The results are shown in Table 4.

After separating the resist, the laminate surface was observed from above thereof by an optical microscope to see whether there occurred the so-called soaking (i.e. undesirable plating under a resist due to soaking of a plating solution between the resist and the substrate) of the solder plating or not. The results are shown in Table 4.

When the soaking occurs during solder plating, solder precipitated by plating is observed beneath the transparent resist.

Also, by using the different specimens, a crosscut test (JIS-K-5400) was conducted after exposure at a light intensity corresponding to the 8th step on the 21-step Stouffer Step Tablet. The results are shown in Table 4.

TABLE 4

|  | Example | | | | Comp. Example (unit: g) | | |
| --- | --- | --- | --- | --- | --- | --- | --- |
|  | 1 | 2 | 3 | 4 | 1 | 2 | 3 |
| Photosensitivity (ST) | 10 | 8 | 8 | 8 | 8 | 8 | 9 |
| Adhesiveness (μm) | 30 | 40 | 40 | 40 | 50 | 50 | 45 |
| Plating resistance |  |  |  |  |  |  |  |
| Separation | Absent | Absent | Absent | Absent | Absent | Present | Present |
| Soaking | Absent | Absent | Absent | Absent | Present | Present | Present |
| Crosscuttability (X/10) | 10 | 10 | 10 | 10 | 8 | 8 | 9 |

As is seen from Table 4, the photosensitive resin compositions of Examples 1–4 according to the present invention have high plating resistance and excellent adhesiveness and crosscuttability.

As described above, the photosensitive resin composition according to the first embodiment of the present invention has excellent adhesiveness, chemical resistance and flexibility, and is further improved in photosensitivity and mechanical properties by adjusting the acid value of the component (A) to be in a range of 100 to 500 and making its weight-average molecular weight fall in a range of 20,000 to 300,000. Further, the alkaline developing performance of the composition is improved by selecting the ratios of the components (A), (B) and (C) such that (A) will be 40 to 80 parts by weight, (B) will be 20 to 60 parts by weight and (C) will be 0.1 to 20 parts by weight per 100 parts by weight of the total of the components (A) and (B). The photosensitive element made by using such a photosensitive resin composition has excellent workability.

EXAMPLES 5–9

The materials shown in Table 5 and Table 6 were blended to prepare the solutions.

TABLE 5

| | Materials | Amount blended |
| --- | --- | --- |
| Component (A) | 40 wt % methyl cellosolve/toluene (6/4 by weight) solution of methacrylic acid/methyl methacrylate/ethyl acrylate/ethyl methacrylate copolymer (22/45/27/6 by weight, weight-average molecular weight: 100,000) (acid value of solids: 144) | 150 g (solids; 60 g) |
| Component (B) | UA21 (compound of the formula (I) wherein $R^1$ is —$C_6H_{12}$—, | 14 g |

TABLE 5-continued

| | Materials | Amount blended |
| --- | --- | --- |
| | $R^3$ is —$CH_3$, X is —$CH_2CH_2O$—, n = 4 (average), available from Shin-Nakamura Chem. Ind. Co., Ltd.) | |
| | APG-400 (polypropylene glycol diacrylate, available from Shin-Nakamura Chem. Ind. Co., Ltd.) | 16 g |
| | γ-chloro-β-hydroxyproyl-β'-methacryloyloxyethyl-o-phthalate | 10 g |
| Component (C) | Diethylthioxanthone | 1.0 g |
| | Ethyl dimethylaminobenzoate | 4.0 g |
| | N,N'-tetraethyl-4,4'-diaminobenzophenone | 0.2 g |

TABLE 6

| | Materials | Amount blended |
| --- | --- | --- |
| Colorant | Tribromomethylphenylsulfone | 0.5 g |
| | Leucocrystal violet | 0.5 g |
| Pigment | Malachite green | 0.05 g |
| Solvent | Methyl ethyl ketone | 10 g |
| | Toluene | 10 g |
| | Methanol | 3 g |
| Plasticizer | p-toluenesulfoneamide | 4.0 g |

In the above solutions was dissolved the component (D) shown in Table 7 to obtain the solutions of the photosensitive resin compositions.

TABLE 7

| | | (unit: g) Example | | | | | |
| --- | --- | --- | --- | --- | --- | --- | --- |
| | | 5 | 6 | 7 | 8 | 9 | 10 |
| Component (D) | Dicyandiamide | 0.1 | — | — | — | — | — |
| | BT*1 | — | 0.1 | — | — | — | — |
| | CBT*2 | — | — | 0.1 | — | — | — |
| | 2MBT*3 | — | — | — | 0.1 | — | — |
| | F-804S*4 | — | — | — | — | 0.1 | — |
| | BT-LX*5 | — | — | — | — | — | 0.1 |

(Notes)
*1: benzotriazole
*2: 5-carboxy-1,2,3-benzotriazole
*3: 2-mercaptobenzoimidazole
*4: 1-(di-2-ethylhexylamino)methyl-5-carboxy-benzotriazole
*5: 1-dioctylaminomethylbenzotriazole Using these solutions of photosensitive resin compositions, the photosensitive elements were made in the same way as in Example 1. The thickness of the photosensitive resin composition layer after drying was 50 μm.

Said photosensitive resin composition layer was laminated on the copper surface of a copper-clad laminate by following the procedure of Example 1, and the photosensitivity of the photosensitive resin compositions was evaluated in the same way as in Example 1. The results are shown in Table 8. Photosensitivity is indicated by the step number on the step tablet. The greater the step number, the higher is photosensitivity.

Adhesiveness was determined from the line width (μm) which remained unseparated after development. The results are shown in Table 8.

Gold plating resistance was determined in the following way. The photosensitive resin composition was laminated on a copper-clad laminate in the manner described above and exposed at a prescribed light intensity. After development with said developer, the pretreatments were carried out in the following order: degreasing (5-minute immersion) →washing with water→soft etching (2-minute immersion) →washing with water→one-minute immersion in 10 wt % sulfuric acid, followed by nickel plating in a nickel plating bath undercurrent application of 3 A/dm$^2$ at 50° C. for 10 minutes.

On completion of nickel plating, the laminate was washed with water and subjected to 40° C., 5 A/dm$^2$ gold strike plating for 20 seconds and 30° C., 1 A/dm$^2$ gold plating for 6 minutes, immediately followed by washing with water and drying.

The following materials were used in the above treatments:

Degreasing: a 25 wt % aqueous solution of PC-455 (Meltex Inc.)

Soft etching: an aqueous solution of 150 g/l ammonium persulfate

Nickel plating bath: an aqueous solution consisting of 350 g/l nickel sulfate, 45 g/l nickel chloride, 45 g/l boric acid, 30 ml/l Nikal PC-3 (trade name, Meltex Inc.) and 0.1 ml/l Nikel Gleam NAW-4 (trade name, Meltex Inc.).

Gold strike plating: Aurobond-TN (trade name, Nippon Electroplating Engineering Co., Ltd.)

Gold plating: Autronex CI (trade name, Nippon Electroplating Engineering Co., Ltd.)

After washing with water and drying, an adhesive tape was pasted to the laminate and then peeled off in the vertical direction (90° peel-off test) to see whether the resist was caused to separate or not. The results are shown in Table 8.

When the soaking of gold plating occurs, gold precipitated by plating can be seen beneath the transparent resist.

Alkali etching was also carried out, and linearity (line indentations) of the linear pattern of gold after removal of copper was observed by an optical microscope, measuring the span between the concavity and the convexity of the indentations. The results are shown in Table 8. When the concavity-convexity span was less than 5 μm, it was judged that there was no line indentations (indicated as "absent" in the tables), and when the span was 5 μm or greater, it was judged that the line indentations were "present".

TABLE 8

| | (unit: g) Example | | | | | |
|---|---|---|---|---|---|---|
| | 5 | 6 | 7 | 8 | 9 | 10 |
| Photosensitivity (ST) | 8 | 8 | 8 | 8 | 8 | 8 |
| Adhesiveness (μm) | 30 | 30 | 35 | 35 | 35 | 35 |
| Plating resistance | | | | | | |
| Separation | Absent | Slightly present | present | Slightly present | present | present |
| Soaking | Absent | Slightly present | present | present | present | present |
| Line indentations | Absent | Absent | present | present | present | present |

As is seen from Table 8, said photosensitive resin composition is improved in gold plating resistance and also provided with excellent adhesiveness and photosensitivity by the addition of dicyandiamide as component (D) to said composition.

EXAMPLES 11–15 AND COMPARATIVE EXAMPLES 4–5

In a solution of the formulation shown in Table 9 was dissolved a component (B') shown in Table 10 to prepare a solution of the second photosensitive resin composition of the present invention.

TABLE 9

| | Materials | Amount blended |
|---|---|---|
| Component (A) | 40 wt % methyl cellosolve/ toluene (6/4 by weight) solution of copolymer of methacrylic acid/methyl methacrylate/ethyl acrylate/ethyl methacrylate (22/45/27/6 by weight, weight-average molecular weight: 100,000) (acid value of solids: 144) | 150 g (solids: 60 g) |
| Component (C') | 2,2'-bis(o-chlorophenyl)- 4,4',5,5'-tetraphenyl- biimidazole | 2.0 g |
| | N,N'-tetraethyl-4,4'- diaminobenzophenone | 0.2 g |
| Colorant | Leucocrystal violet | 0.5 g |
| Pigment | Malachite green | 0.05 g |
| Solvent | Acetone | 10 g |
| | Toluene | 10 g |
| | Methanol | 3 g |

TABLE 10

| | Component (B') | | | |
|---|---|---|---|---|
| | UA-21*1 | APG-400*2 | MECHPP*3 | HOA-MPEH*4 |
| Example 11 | 40 | — | — | — |
| Example 12 | 20 | 20 | — | — |
| Example 13 | 10 | 20 | 10 | — |
| Example 14 | 5 | 25 | 5 | 5 |
| Example 15 | 1 | 39 | — | — |
| Comp. Example 4 | — | 40 | — | — |
| Comp. Example 5 | — | 30 | 5 | 5 |

(Notes)
*1: compound of the formula (I) which is the same as shown on page 25 (available from Shin-Nakamura Chem. Ind. Co., Ltd.)
*2: polypropylene glycol diacrylate (available from Shin-Nakamura Chem. Ind. Co., Ltd.)
*3: γ-chloro-β-hydroxypropyl-β'-methacryloyloxyethyl-o-phthalate
*4: β-hydroxypropyl-β'-methacryloyloxyethyl-o-phthalate Using these photosensitive resin compositions, the photosensitive elements were made in the same way as in Example 1.

Also, tests were conducted on photosensitivity (ST), adhesiveness (μm), plating resistance and crosscuttability in the same way as in Example 1. The results are shown in Table 11.

TABLE 11

| | Photosensitivity (step) | Adhesiveness (m) | Plating resistance | | Crosscuttability (x/10) |
|---|---|---|---|---|---|
| | | | Separation | Soaking | |
| Example 11 | 20 | 35 | Absent | Absent | 10 |
| Example 12 | 15 | 30 | Absent | Absent | 10 |

TABLE 11-continued

| | Photosensitivity (step) | Adhesiveness (m) | Plating resistance | | Crosscuttability (x/10) |
| --- | --- | --- | --- | --- | --- |
| | | | Separation | Soaking | |
| Example 13 | 13 | 30 | Absent | Absent | 10 |
| Example 14 | 10 | 30 | Absent | Absent | 9 |
| Example 15 | 8 | 50 | Present | Absent | 8 |
| Comp. Example 4 | 8 | 50 | Present | Absent | 7 |
| Comp. Example 5 | 8 | 40 | Present | Present | 7 |

As is seen from Table 11, the photosensitive elements made by using the second photosensitive resin compositions of Examples 11–14 according to the present invention have high photosensitivity, plating resistance, adhesiveness and crosscuttability.

As described above, the second photosensitive resin composition according to the present invention has high photosensitivity, adhesiveness, chemical resistance, flexibility and plating bath anti-contamination properties.

Also, by adjusting the acid value of the component (A) to fall in a range of 100 to 500 and making its weight-average molecular weight fall a range of 20,000 to 300,000, the developing performance by an alkaline developer can be enhanced.

Further, mechanical strength can be improved by blending the components (A), (B') and (C') in the ratios of 40 to 80 parts by weight, 20 to 60 parts by weight and 0.1 to 20 parts by weight, respectively, per 100 parts by weight of the total of the components (A) and (B') and by containing a compound of the formula (IV) in the component (B') in an amount of 3 parts by weight or more.

The photosensitive elements obtained by using the second photosensitive resin composition of the present invention show excellent developing performance in use with an alkaline developer and also have high mechanical strength and excellent workability.

What is claimed is:

1. A photosensitive resin composition comprising:

(A) a binder polymer having carboxyl groups;

(B) at least one photopolymerizable compound having a polymerizable ethylenically unsaturated group in the molecule, (C) a photoinitiator; and (D) a dicyandiamide, said component (B) containing a compound represented by the formula (I):

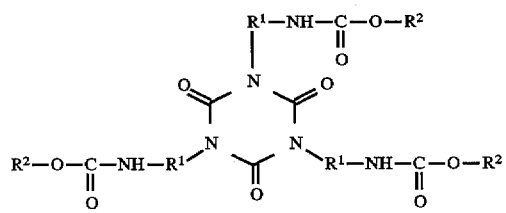

wherein R¹ is a divalent organic group and R² represents the formula (II):

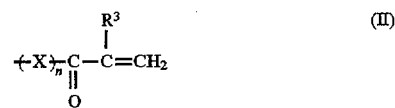

wherein R³ is a hydrogen atom or a methyl group; X is an alkylene oxide group; and n is an integer of 1 to 14.

2. A photosensitive resin composition according to claim 1, wherein the dicyandiamide is contained in an amount of 0.01 to 1 part by weight per 100 parts by weight of the total of the components (A) and (B).

3. A photosensitive element comprising a base material and a photosensitive resin composition of claim 1.

4. A photosensitive resin composition comprising:

(A) a binder polymer having carboxyl groups, which is soluble or swellable in an alkaline aqueous solution and has an acid value of 100 to 500 and a weight-average molecular weight of 20,000 to 300,000;

(B) at least one photopolymerizable compound having a polymerizable ethylenically unsaturated group in the molecule;

(C) a photoinitiator; and (D) a dicyandiamide, said component (B) containing a compound represented by the formula (I):

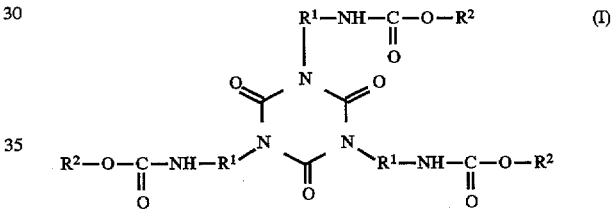

wherein R¹ is a divalent organic group and R² represents the formula (II):

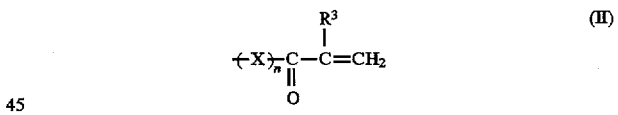

wherein R³ is a hydrogen atom or a methyl group; X is an alkylene oxide group; and n is an integer of 1 to 14.

5. A photosensitive resin composition comprising:

(A) a binder polymer having carboxyl groups;

(B) at least one photopolymerizable compound having a polymerizable ethylenically unsaturated group in the molecule; and (C) a photoinitiator, said component (B) containing a compound represented by the formula (I):

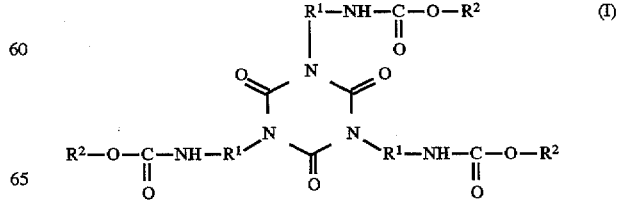

wherein $R^1$ is a divalent organic group and $R^2$ represents the formula (II):

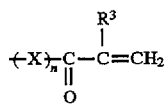

wherein $R^3$ is a hydrogen atom or a methyl group; X is —$CH_2$—$CH_2$—O—; and n is an integer of 1 to 14.

6. A photosensitive resin composition comprising:

(A) a binder polymer having carboxyl groups;

(B) at least one photopolymerizable compound having a polymerizable ethylenically unsaturated group in the molecule; and (C) a photoinitiator, said component (B) containing a compound represented by the formula (I):

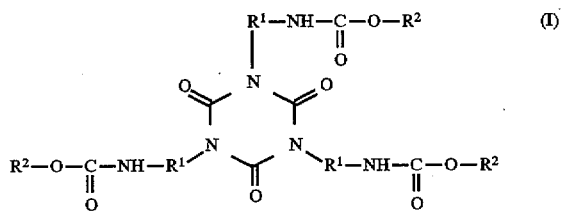

wherein $R^1$ is a divalent organic group and $R^2$ represents the formula (II):

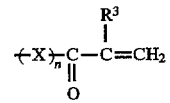

wherein $R^3$ is a hydrogen atom or a methyl group; X is —$(CH_2)_m$—O—, where m is an integer of 3 to 6; and n is an integer of 1 to 14.

* * * * *